United States Patent
Iriguchi et al.

(10) Patent No.: US 10,173,902 B2
(45) Date of Patent: Jan. 8, 2019

(54) AMORPHOUS SILICA AND PROCESS FOR PRODUCING SAME

(75) Inventors: Jiro Iriguchi, Himeji (JP); Yasuhiro Yamamoto, Himeji (JP); Shuji Shimizu, Suita (JP); Yuji Ono, Himeji (JP)

(73) Assignee: NIPPON SHOKUBAI CO., LTD., Osaka (JP)

(*) Notice: Subject to any disclaimer, the term of this patent is extended or adjusted under 35 U.S.C. 154(b) by 424 days.

(21) Appl. No.: 13/502,850

(22) PCT Filed: Oct. 20, 2010

(86) PCT No.: PCT/JP2010/068465
§ 371 (c)(1), (2), (4) Date: Apr. 19, 2012

(87) PCT Pub. No.: WO2011/049121
PCT Pub. Date: Apr. 28, 2011

(65) Prior Publication Data
US 2012/0202923 A1 Aug. 9, 2012

(30) Foreign Application Priority Data
Oct. 20, 2009 (JP) ................ 2009-241668

(51) Int. Cl.
*C01B 33/145* (2006.01)
*H01L 21/56* (2006.01)
(Continued)

(52) U.S. Cl.
CPC ......... *C01B 33/145* (2013.01); *C08G 59/42* (2013.01); *C08K 3/36* (2013.01); *C08K 2201/003* (2013.01); *H01L 21/563* (2013.01)

(58) Field of Classification Search
CPC .................................... C01B 33/145
(Continued)

(56) References Cited

U.S. PATENT DOCUMENTS 5,338,353 A    8/1994 Uchino et al.
5,821,456 A *  10/1998 Wille .............. H01L 21/563
                                                    174/527

(Continued)

FOREIGN PATENT DOCUMENTS

JP    62052119 A  *  3/1987
JP    63-291807      11/1988
(Continued)

OTHER PUBLICATIONS

Notice of Final Rejection dated Mar. 27, 2014 in Korean Application No. 10-2012-7012668, with English translation.
(Continued)

*Primary Examiner* — Randy P Gulakowski
*Assistant Examiner* — Ha S Nguyen
(74) *Attorney, Agent, or Firm* — Wenderoth, Lind & Ponack, LLP

(57) ABSTRACT

Provided are amorphous silica particles for application to industrial fields where there are increasing desires for high purity and colorlessness. The amorphous silica particles are produced through the steps of hydrolysis of an alkoxide, vacuum drying, and firing. The amorphous silica particles have been reduced in coloration and in Fe content, which is causative of coloration of the silica, and can meet the desires. The amorphous silica is characterized by having an Fe content of 20 ppm or less.

10 Claims, 1 Drawing Sheet

(51) Int. Cl.
*C08G 59/42* (2006.01)
*C08K 3/36* (2006.01)

(58) Field of Classification Search
USPC .......................................... 523/466; 264/261
See application file for complete search history.

(56) References Cited

U.S. PATENT DOCUMENTS

| | | |
|---|---|---|
| 2003/0069347 A1 | 4/2003 | Oishi et al. |
| 2007/0160520 A1 | 7/2007 | Oishi et al. |
| 2010/0171146 A1 | 7/2010 | Takeuchi et al. |

FOREIGN PATENT DOCUMENTS

| | | | |
|---|---|---|---|
| JP | 3-288538 | | 12/1991 |
| JP | 10-287415 | | 10/1998 |
| JP | 2002-37620 | | 2/2002 |
| JP | 2002-37621 | | 2/2002 |
| JP | 2003-176121 | | 6/2003 |
| JP | 2005-22915 | | 1/2005 |
| JP | 2005022915 A | * | 1/2005 |
| JP | 2007-70159 | | 3/2007 |
| JP | 2008-137854 | | 6/2008 |
| JP | 2008137854 A | * | 6/2008 |
| JP | 2010-228997 | | 10/2010 |
| TW | 200913181 | | 3/2009 |
| WO | 2008/123373 | | 10/2008 |

OTHER PUBLICATIONS

Notice of Reasons for Refusal dated May 13, 2014 in corresponding Japanese Application No. 2011-537277.
International Search Report dated Jan. 25, 2011 in International (PCT) Application No. PCT/JP2010/068465, of which the present application is the national stage.
Office Action dated Sep. 12, 2013 in Korean Application No. 10-2012-7012668, with English translation.
Office Action dated Oct. 30, 2013 in Taiwanese Application No. 099135706, with English translation.
Second Notification of Office Action dated Jan. 2, 2014 in Chinese Application No. 201080046924.5, with English translation.
Office Action dated Jul. 22, 2013 in corresponding Chinese Application No. 201080046924.5, with English translation.
Chinese Office Action dated Sep. 11, 2014 in corresponding CN Application No. 201080046924.5 with English translation.
Chinese Office Action dated Mar. 31, 2015, issued in corresponding Chinese Patent Application No. 201080046924.5. (With English translation).

\* cited by examiner

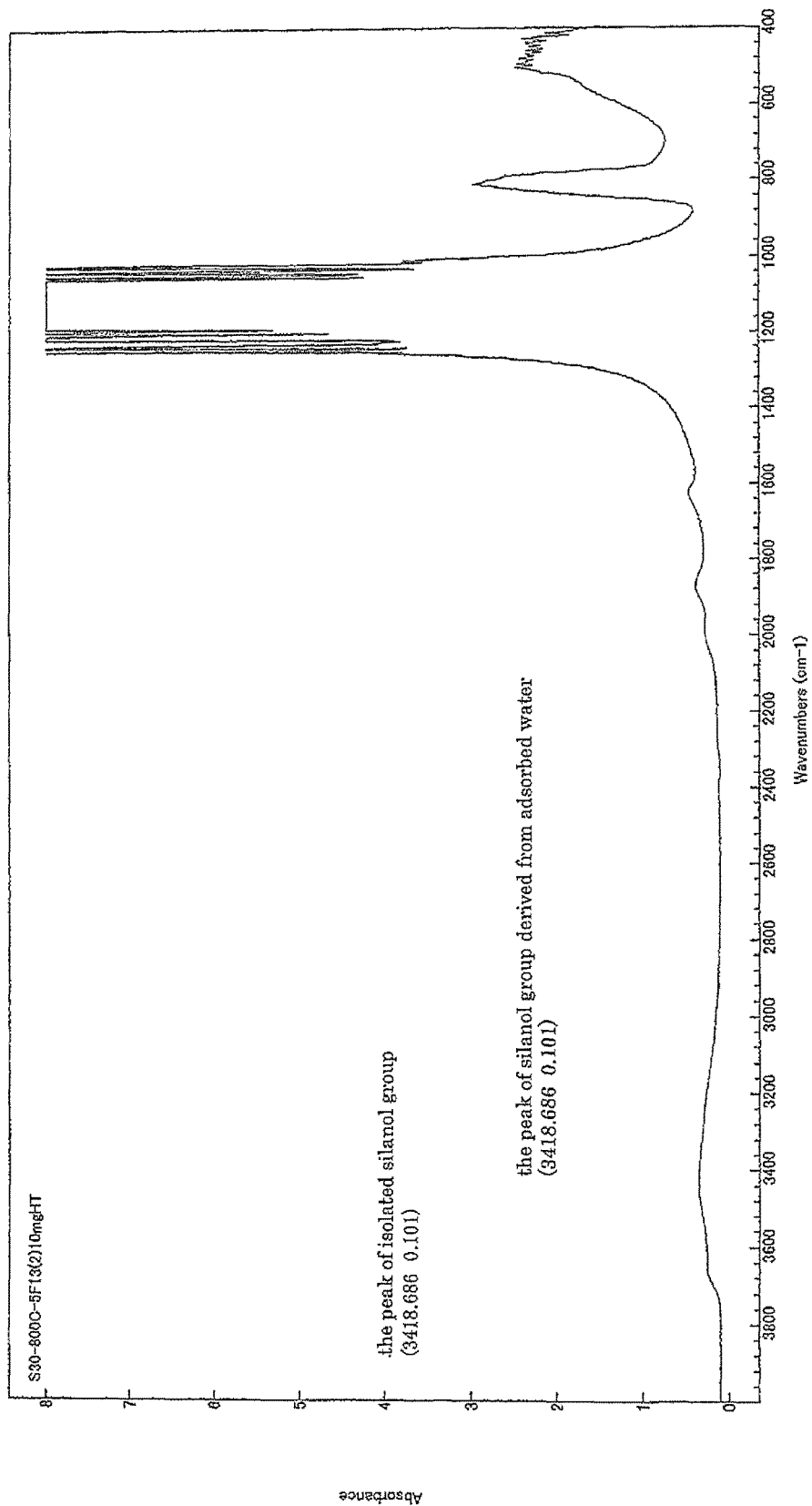

US 10,173,902 B2

AMORPHOUS SILICA AND PROCESS FOR PRODUCING SAME

TECHNICAL FIELD

The present invention relates to amorphous silica with a low content of Fe, an impurity, which is obtained by drying a hydrolysis-condensation product of an alkoxysilane and thereafter, firing the product and to a process for producing the same.

BACKGROUND ART

Inorganic fine particles are excellent in such as strength and heat resistance, and therefore, used in various fields. Particularly, silica has been widely used for an anti-blocking agent and a slip agent for various kinds of films such as polyester films, polyimide films, and fluororesin films; a spacer such as an in-plane spacer for liquid crystal display devices, a seal spacer for liquid crystal display devices, a spacer for EL display devices, a spacer for touch panels, and a spacer such as a gap-retaining agent for various kinds of substrates of ceramics, plastics, or the like; a sealing material for various kinds of electronic parts such as a sealing material for semiconductors, a sealing material for liquid crystals, and a sealing material for LED emitting devices; a light diffusion agent to be used for light diffusion films, light diffusion plates, light-leading plates, anti-glare films, or the like; an additive for cosmetics such as white body pigments; a dental material; and the like.

Such silica has been conventionally produced by hydrolytic polycondensation of a silicon alkoxide (alkoxysilane) (Patent Documents 1 to 3).

The applicant of the present application also employs a hydrolytic polycondensation process of a silicon alkoxide at the time of producing fired silica with low hygroscopicity (Patent Documents 4, 5, and 6). In Patent Document 5, particularly, it is proposed to employ a vacuum drying apparatus in order to obtain a dry powder of silica particles without agglomeration after having got a slurry of silica particles in monodispersion state. This vacuum drying apparatus is used for drying a liquid containing solid content in reduced pressure while heating the inside of a long tubular heater to introduce the obtained powder into a vacuum collecting chamber, followed by collecting the powder by filter, and is configured not to cause secondary agglomeration since the particles in the slurry are dried almost instantaneously.

PRIOR ART DOCUMENTS

Patent Documents

Patent Document 1: Japanese Patent Publication Laid-Open No. Sho 63-291807
Patent Document 2: Japanese Patent Publication Laid-Open No. Hei 10-287415
Patent Document 3: Japanese Patent Publication Laid-Open No. 2002-37621
Patent Document 4: Japanese Patent Publication Laid-Open No. Hei 3-288538
Patent Document 5: Japanese Patent Publication Laid-Open No. 2003-176121
Patent Document 6: Japanese Patent Publication Laid-Open No. 2008-137854

SUMMARY OF THE INVENTION

Problems to be Solved by the Invention

The present inventors have noticed slight colorization of the silica particles after firing and have investigated on the cause of the colorization. Consequently, the inventors have found that the colorization is attributed to a metal component, particularly iron (Fe), contaminated in the silica particles in the drying step of the vacuum drying apparatus.

Since silica with colorless, a small content of impurity elements (particularly halogens and metals other than Si), low hygroscopicity and a sharp particle size distribution without secondary agglomeration (excellent in monodispersibility) has been required for a semiconductor sealing material or a spacer material for liquid crystal display devices, the slight coloration due to contamination with Fe is a serious problem. The presence of alkali metals or halogens in a semiconductor sealing material and an LED (Light Emitting Diode) sealing material becomes a cause of deterioration of electrodes, wiring materials, or the like, which are objects to be sealed. Particularly, in a sealing material for mounting a semiconductor, since conductive fine particles are used as a conductive material for connecting terminals and the contact area of the sealing material and the conductive material becomes significantly wide, there is a concern that not only impurities such as alkali metals are strictly limited but also the presence of transition metals bearing magnetism (particularly Fe having magnetism in the form of both a metal and an oxide) may possibly cause an adverse effect on conduction properties.

There is known a fusion method as a method for obtaining silica particles with high purity other than the alkoxide method in which the step of drying a slurry is indispensable. However, it is difficult to obtain silica particles with fine particle diameters in sharp particle size distribution by the fusion method. There is also known a method, as a method for decreasing impurities, for treating a coagulated product obtained by bringing an aqueous alkali metal silicate solution into contact with an aqueous acidic solution with an acid-containing solution and thus extracting impurities. However, even this method is difficult to obtain spherical silica with uniform particle diameters.

As a conventional alkoxide method, in the case where a vacuum drying apparatus is not used for drying a slurry, secondary agglomeration is caused during the drying and it becomes impossible to obtain silica particles with fine particle diameters in sharp particle size distribution. Further, silica particles obtained by an alkoxide method, that is, the hydrolytic condensation reaction of alkoxysilanes, have a large number of active alkoxy groups or hydroxyl groups (silanol groups) on their surfaces. Therefore, in the case of a conventional drying process (e.g., drying under reduced pressure), particles come close to one another by solvent removal and if drying is carried out (completed) in this state, the secondary agglomeration force among particles is increased due to the action of alkoxy groups present in the silica particle surfaces. Consequently, in order to crack the secondarily agglomerated silica particles to primary particles, very high impact is required for the particles and as a result, there occurs a problem that Fe is contaminated at the time of cracking.

Incidentally, isolated silanol groups are present on the surfaces of silica particles produced by an alkoxide method, and if many isolated silanol groups are present, the silica particles tend to be agglomerated easily. The isolated silanol groups can be removed by heating the silica particles at a temperature beyond 1200° C.; however, if a heat treatment is carried out at such a high temperature, the silica particles are firmly agglomerated and it becomes significantly difficult to crack the silica particles to primary particles. In the case of cracking the firmly agglomerated silica particles to primary particles, it is necessary to increase the impact applied to the particles, and there occurs a problem that Fe is contaminated at the time of cracking.

Consequently, in terms of application of silica to industrial fields where demands for purity and colorlessness are high, the present invention aims to lower the coloration of silica and the content of Fe, which is a cause of coloration of silica, in silica, and to provide amorphous silica particles which can meet the demands through the steps of hydrolysis of an alkoxide, vacuum drying, firing, or the like.

Solutions to the Problems

The amorphous silica of the present invention with which the above mentioned problems are solved has a characteristic of having a Fe content of 20 ppm or less. The amorphous silica is preferable to have a saturated moisture content of 1% by mass or less after being allowed to stand at 30° C. and 90% RH for 1 day. The amorphous silica has an average particle diameter of preferably 0.1 μm or more and 2 μm or less, a variation coefficient in the particle diameter of preferably 10% or less, an average spherical ratio of preferably 1.0 or more and 1.2 or less, and a content of coarse particles of preferably 0.05% by mass or less.

It is preferable that in an infrared absorption spectrum, the amorphous silica has a ratio ($A_1/A_2$) of the maximum absorbance ($A_1$) of the peak of isolated silanol group to the maximum absorbance ($A_2$) of the peak of silanol group derived from adsorbed water of less than 1.0. The amorphous silica is preferable to be surface-treated with a silane coupling agent.

The amorphous silica is preferable to be used as a sealing material and particularly preferable to be used as an underfill encapsulant. The present invention also includes an underfill encapsulant comprising the amorphous silica and a resin.

A process for producing amorphous silica according to the present invention has a characteristic of comprising drying a slurry of a hydrolysis-polycondensation product of a silicon alkoxide and firing silica particles obtained after the drying at 800° C. or higher and 1200° C. or lower.

The drying of the slurry is preferably carried out using a vacuum drying apparatus having a heating tube which is externally heated and retained in reduced pressure, where one end of which is connected to a supply part of the slurry of silica particles and the other end of which is connected to a powder collecting chamber retained in reduced pressure. The heating tube is preferably configured by alternately joining straight tubes and elbows (knee bends). The number of the straight tubes configuring the heating tube is preferably 2 or more and 4 or less and adjustment of the inner diameter of the heating tube to 8 mm or more is also effective to decrease the Fe content in the silica.

Effects of the Invention

Amorphous silica with a low Fe content can be provided. The production process of the present invention can produce the above-mentioned amorphous silica with simple configuration.

BRIEF DESCRIPTION OF THE DRAWINGS

FIG. 1 is one example of an infrared absorption spectrum of amorphous silica according to the present invention.

MODE FOR CARRYING OUT THE INVENTION

1. Characteristics of Amorphous Silica

The amorphous silica of the present invention is obtained through the steps of hydrolytic polycondensation of a silicon alkoxide, vacuum drying, and firing. The amorphous silica has a characteristic of having a Fe content of 20 ppm or less (mass basis).

Amorphous silica in the form of a dispersion of water or an organic solvent as a medium or in the form of a powder is distributed in the market, and in any form, the amorphous silica of the present invention needs to have a Fe content of 20 ppm or less. It is because if it exceeds 20 ppm, slight coloration is observed. Further, in the case where the amorphous silica contains Fe, Fe may possibly inhibit reaction of a silane coupling agent and silanol groups when the amorphous silica surface is treated with the silane coupling agent as described below. However, if the Fe content is low, the reaction of a silane coupling agent and silanol groups is not inhibited and the amorphous silica surface can be treated more uniformly. The Fe content is preferably 12 ppm or less, more preferably 6 ppm or less, and even more preferably 2 ppm or less. In order to lower the Fe content as described above, a vacuum drying step described below is employed.

The amorphous silica of the present invention is preferable to have a saturated moisture content of 1% by mass or less. The saturated moisture content is a value obtained by measuring the mass of the amorphous silica before and after the silica is allowed to stand in environments of 30° C. and 90% RH for 1 day and dividing the increase by the mass of the silica before standing. The measurement process will be described in detail in examples. If the saturated moisture content is higher than 1% by mass, in the case where the amorphous silica is used as a semiconductor sealing material, a spacer for liquid crystal display devices or the like, a fear of deterioration of peripheral materials due to the absorbed moisture of the silica particles may possibly be increased. As the saturated moisture content is smaller, it is more favorable, and it is preferably 0.5% by mass or less, more preferably 0.2% by mass or less, furthermore preferably 0.1% by mass or less, and particularly preferably 0.05% by mass or less. In order to lower the saturated moisture content, the amorphous silica may be fired as described below.

The silica particles have an average particle diameter of preferably 0.01 μm or larger and 100 μm or smaller. Since the silica particles highly effective to lower the Fe content by employing the present invention are particles having an average particle diameter of 0.05 μm or larger, the silica particles having an average particle diameter of 0.05 μm or larger are more preferable, and the silica particles having an average particle diameter of 0.1 μm or larger are even more preferable. The upper limit of the average particle diameter of the silica particles is preferably 20 μm, more preferably 10 μm, and even more preferably 2 μm. The above-mentioned average particle diameter is an average particle diameter obtained by measuring the diameters of arbitrary particles in the number of 50 or more and 100 or less using, for example, a scanning electron microscope (SEM) and calculating it based on the number of the particles. The particle diameter of the silica particles has a variation coefficient of preferably 20% or less, more preferably 10% or less, and even more preferably 8% or less.

The silica particles have an average spherical ratio of preferably 1.2 or less, more preferably 1.1 or less, and even more preferably 1.05 or less, and substantially true spherical shape is preferable. If the average spherical ratio is 1.2 or less, for example, in the case where the silica particles are used as a filler for a sealing material, damages on metal wiring such as wire which is susceptible to damages can be suppressed at the time of sealing or curing an IC chip or an LED device. The average spherical ratio is an average value of the ratio of the major axis and the minor axis (major axis/minor axis) of particles, and denotes the sphericity of the particles. A process for measuring the average spherical ratio will be described in detail below. The lower limit of the average spherical ratio is 1.

The content of coarse particles is preferably 0.05% by mass or less, more preferably 0.02% by mass or less, even more preferably 0.01% by mass or less, and particularly preferably 0.005% by mass or less. If the content of coarse particles is 0.05% by mass or less, for example, in the case where the silica particles are used as a filler for a sealing material, damages on metal wiring such as wire which is susceptible to damages can be suppressed at the time of sealing or curing an IC chip or an LED device. Further, in the case where the silica particles are used particularly for an underfill encapsulant, permeability into fine gaps can be improved. The coarse particles are particles remaining on a sieve when the silica particles are allowed to pass through a sieve having an opening of 20 μm. A process for measuring the content of the coarse particles will be described in detail below.

The amorphous silica has silanol groups derived from adsorbed water on its surface. Since such silanol groups are present, a silane coupling agent tends to be bonded to the silica particle surface and the silane coupling agent can be bonded uniformly to the silica particle surface. The silanol groups derived from adsorbed water are silanol groups derived from water adsorbed to the silica particles. The amorphous silica may have isolated silanol groups. The isolated silanol groups are silanol groups which are not bonded with water adsorbed to the silica particles. The presence or absence of these silanol groups can be confirmed by a Fourier transform infrared absorption spectrum (FT-IR), and an absorption peak derived from the isolated silanol group is observed at around 3750 $cm^{-1}$ and an absorption peak derived from the silanol group derived from adsorbed water is observed in a range from 3400 $cm^{-1}$ to 3500 $cm^{-1}$. In the infrared absorption spectrum, an absorption peak derived from the siloxane bond (Si—O—Si) configuring the silica particles is observed in a range from 1000 $cm^{-1}$ to 1050 $cm^{-1}$. One example of the infrared absorption spectrum of amorphous silica is shown in FIG. 1. The presence or absence, amounts, ratios, and the like of the silanol groups derived from adsorbed water, isolated silanol groups, and siloxane bond (Si—O—Si) of the present invention are based on the peak intensity (absorbance) in the wavelength region of the above-mentioned FT-IR.

Since the silica particles having isolated silanol groups tend to cause agglomeration with a high agglomeration force, it is preferable to have isolated silanol groups in a small quantity, and more preferable to have no silanol group. Specifically, in the infrared absorption spectrum, the ratio $(A_1/A_0)$ of the maximum absorbance $(A_0)$ of the peak of siloxane bond and the maximum absorbance $(A_1)$ of the peak of isolated silanol group is preferably 0.1 or less, more preferably 0.01 or less, even more preferably 0.002 or less, and particularly preferably 0.001 or less.

In the infrared absorption spectrum, the ratio $(A_2/A_0)$ of the maximum absorbance $(A_0)$ of the peak of siloxane bond and the maximum absorbance $(A_2)$ of the peak of silanol group derived from adsorbed water is preferably 0.1 or less, more preferably 0.05 or less, even more preferably 0.02 or less, furthermore preferably 0.01 or less, and particularly preferably 0.004 or less. If the ratio $(A_2/A_0)$ is 0.1 or less, in the case where the amorphous silica is used as a semiconductor sealing material, a filler for liquid crystal sealing materials, a spacer for liquid crystal display devices or the like, deterioration of peripheral materials due to the adsorbed water of the silica particles can be further suppressed. The ratio $(A_2/A_0)$ is preferably 0.00001 or more, and even more preferably 0.0001 or more.

It is preferable that, in the infrared absorption spectrum, the amorphous silica has a ratio $(A_1/A_2)$ of the maximum absorbance $(A_1)$ of the peak of isolated silanol group and the maximum absorbance $(A_2)$ of the peak of silanol group derived from adsorbed water of less than 1.0. In the case where the silica particles are surface-treated with a silane coupling agent as described below, the silane coupling agent is bonded more preferentially to the silanol groups derived from adsorbed water than to the isolated silanol groups, and the isolated silanol groups tend to remain. However, if the ratio $(A_1/A_2)$ is less than 1.0, the remaining isolated silanol groups are covered and concealed with the silane coupling agent bonded to the silanol groups derived from adsorbed water, and agglomeration due to the isolated silanol groups can be suppressed. The ratio $(A_1/A_2)$ is more preferably 0.8 or less, even more preferably 0.6 or less, furthermore preferably 0.4 or less, still furthermore preferably 0.3 or less, and particularly preferably 0.2 or less. The ratio $(A_1/A_2)$ is generally 0.01 or more in the case where the amorphous silica of the prevent invention is fired in a preferable firing condition as described below.

The amorphous silica is preferable to be surface-treated with a silane coupling agent. If the amorphous silica is subjected to the surface treatment, the dispersibility in an epoxy resin or the like becomes favorable, and the fluidity of the resin in which the amorphous silica is dispersed is also improved.

Examples of the silane coupling agent include alkoxysilane compounds of vinyl group-containing alkoxysilanes such as trimethoxyvinylsilane and triethoxyvinylsilane, epoxy group-containing alkoxysilanes such as 3-glycidoxypropyltrimethoxysilane, 3-glycidoxypropylmethyldimethoxysilane, and 3-glycidoxypropylmethyldiethoxysilane, methacryloxy group-containing alkoxysilanes such as 3-methacryloxypropylmethyldimethoxysilane, 3-methacryloxypropyltrimethoxysilane, 3-methacryloxypropylmethyldiethoxysilane, and 3-methacryloxypropyltriethoxysilane, acryloxy group-containing alkoxysilanes such as 3-acryloxypropyltrimethoxysilane, mercapto group-containing alkoxysilanes such as 3-mercaptopropyltrimethoxysilane, and amino group-containing alkoxysilanes such as 3-(2-aminoethylamino)propyltrimethoxysilane; chlorosilane compounds such as 3-chloropropylmethyldimethoxysilane, 3-chloropropyltrimethoxysilane, methyltrichlorosilane, dimethyldichlorosilane, trimethylchlorosilane, vinyltrichlorosilane, methylvinyldichlorosilane, phenyltrichlorosilane, diphenyldichlorosilane, and methyldiphenylchlorosilane; acyloxysilane compounds such as tetraacetoxysilane, methyltriacetoxysilane, phenyltriacetoxysilane, dimethyldiacetoxysilane, diphenyldiacetoxysilane, and trimethylacetoxysilane; silanol compounds such as dimethylsilanediol, diphenylsilanediol, and trimethylsilanol; silazanes such as 1,1,1,3,3,3-hexamethyldisilazane, 1,1,3,3-tetramethyldisilazane, 1,3-bis(3,3,3-trifluoropropyl)-1,1,3,3-tetramethyldisilazane, 1,3-bis(chloromethyl)tetramethyldisilazane, 1,3-diphenyltetramethyldisilazane, 1,3-divinyl-1,1,3,3-tetramethyldisilazane, 2,2,4,4,6,6-hexamethylcyclotrisilazane, 2,4,6-trimethyl-2,4,6-trivinylcyclotrisilazane, heptamethyldisilazane, octamethylcyclotetrasilazane, lithium hexamethyldisilazane, sodium hexamethyldisilazane, and potassium hexamethyldisilazane; silane(Si—H) compounds such as 1,1,2,2-tetraphenyldisilane, 1,1,3,3-tetramethyldisiloxane, 1,2-bis(dimethylsilyl)benzene, 2-(dimethylsilyl)pyridine, chlorodiisopropylsilane, chlorodimethylsilane, di-tert-butylsilane, dichloroethylsilane, dichloromethylsilane, diethoxymethylsilane, diethylsilane, dimethoxy(methyl)silane, dimethylphenylsilane, diphenylsilane, diphenylmethylsilane, phenylsilane, N,O-bis(diethylhydrogensilyl)trifluoroacetamide, tert-butyldimethylsilane, tetrakis(dimethylsilyl)silane, tribenzylsilane, tributylsilane, triethoxysilane, triethylsilane, trihexylsilane, triisopropylsilane, triphenylsilane, and tris(trimethylsilyl)silane. These silane coupling agents may be used alone or two or more thereof may be used in combination. Among them, from the viewpoint of improving dispersibility in a resin, silazanes, vinyl group-containing alkoxysilanes, and epoxy group-containing alkoxysilanes are preferable. For the purpose of not containing any halogen, it is preferable not to use those containing a halogen.

2. Process for Producing Amorphous Silica

Amorphous silica particles having a Fe content of 20 ppm or less can be produced by, for example, drying a slurry of a hydrolysis-polycondensation product of a silicon alkoxide with a vacuum drying apparatus having a prescribed configuration. Use of the vacuum drying apparatus having a prescribed configuration suppresses secondary agglomeration in the drying step and gives amorphous silica particles with suppressed Fe contamination. The vacuum drying apparatus having a prescribed configuration is a vacuum drying apparatus having a heating tube which is externally heated and retained in reduced pressure, where one end of which is connected to a supply part of the slurry of silica particles and the other end of which is connected to a powder collecting chamber retained in reduced pressure, and the heating tube is configured by alternately joining straight tubes and elbows, and satisfying at least one of the following (a) and (b).

(a) The number of the straight tubes configuring the heating tube is 2 or more and 4 or less.
 (b) The heating tube has an inner diameter of exceeding 8 mm.

In the case where the amorphous silica particles are used as a filler for sealing materials for mounting a semiconductor or for an LED device, the amorphous silica particles are required to have low hygroscopicity, and in order to satisfy the requirement, for example, the amorphous silica particles after drying may be fired at 800° C. or higher and 1200° C. or lower.

2-1. Hydrolytic-Polycondensation Step of Silicon Alkoxide

Hereinafter, one example of a process for producing amorphous silica particles will be described along with the production steps in turn. In order to obtain the amorous silica particles of the present invention, first, the step of hydrolytic-polycondensation of a silicon alkoxide is carried out. The hydrolytic-polycondensation is promoted by adding a silicon alkoxide to a mixed solvent of water and an organic solvent, followed by stirring, to obtain a slurry of spherical silica particles.

Examples of the silicon alkoxide capable of being used include known alkoxysilanes such as tetramethoxysilane, tetraethoxysilane, tetraisopropoxysilane, tetrabutoxysilane, methyltrimethoxysilane, methyltriethoxysilane, trimethoxyvinylsilane, triethoxyvinylsilane, 3-glycidoxypropyltrimethoxysilane, 3-mercaptopropyltrimethoxysilane, 3-(2-aminoethylamino)propyltrimethoxysilane, phenyltrimethoxysilane, phenyltriethoxysilane, dimethyldimethoxysilane, dimethyldiethoxysilane, 3-glycidoxypropylmethyldimethoxysilane, 3-glycidoxypropylmethyldiethoxysilane, diphenyldimethoxysilane, diphenyldiethoxysilane, dimethoxydiethoxysilane, trimethylmethoxysilane, and trimethylethoxysilane. One or more of these compounds may be used. For the purpose of not containing any halogen, it is preferable not to use a haloalkoxysilane.

Those hydrophilic solvents are preferable as the organic solvent and examples thereof include alcohols such as methanol, ethanol, isopropanol, n-butanol, isobutanol, sec-butanol, tert-butanol, pentanol, ethylene glycol, propylene glycol, and 1,4-butanediol; ketones such as acetone and methyl ethyl ketone; esters such as ethyl acetate, and these solvents may be used alone or two or more thereof may be used by mixing.

A concentration of the silicon alkoxide in the mixed solution of the mixed solvent and the silicon alkoxide is preferable to be used in a range of 0.05 mol/L or more and 4 mol/L or less (more preferably 1.0 mol/L or more and 3 mol/L or less and even more preferably 1.2 mol/L or more and 3 mol/L or less). The water content in the mixed solution is preferably 2 mol/L or more and 25 mol/L or less (more preferably 5 mol/L or more and 20 mol/L or less). Further, as a catalyst, ammonia, urea, amines, or the like may be added. In the case of using the catalyst, the catalyst content in the mixed solution is preferably 0.5 mol/L or more and 10 mol/L or less (more preferably 1 mol/L or more and 5 mol/L or less). If the concentrations of the silicon alkoxide, water, and catalyst in the mixed solution are adjusted to fall within the above-mentioned ranges, it becomes easy to obtain amorphous silica with isolated silanol groups in a small quantity or no isolated silanol group after firing.

Examples of a method for mixing the organic solvent, water, silicon alkoxide, and catalyst (to be added if necessary) include a method for mixing them collectively (embodiment 1); and a method for mixing a portion of the organic solvent with the water and catalyst and thereafter dropwise adding a mixed solution of the remaining of the organic solvent and the silicon alkoxide thereto (embodiment 2), and the embodiment 2 is preferable.

The reaction temperature is properly selected between 0° C. or higher and 100° C. or lower and the reaction time is properly selected between 30 minutes or longer and 100 hours or shorter. This step gives a slurry containing silica particles with sharp particle size distribution dispersed in the mixed solvent.

2-2. Vacuum Drying Step

Next, the slurry is vacuum dried. In this case, the slurry (reaction solution) obtained in the step of hydrolytic-polycondensation of a silicon alkoxide may be subjected to the vacuum drying as it is, or the slurry may be subjected to the vacuum drying after the concentration of the silica particles or the solvent composition is adjusted. In order to quickly remove the solvent from the slurry in the vacuum drying step, it is preferable that the ratio of the organic solvent in the solvent components is higher and that the water content is lower. It is because water which has high latent heat of evaporation and is thus difficult to be evaporated may possibly become a cause of secondary agglomeration of the silicon particles in the drying step. Specifically, in the case where the total amount of the solvent is defined as 100% by mass, the amount of the organic solvent other than water is preferably 50% by mass or more, and more preferably 80% by mass or more. As the organic solvent, solvents with a low boiling point are preferable and specifically, an organic solvent having a boiling point of 120° C. or lower in normal pressure is preferable, and particularly preferably an aliphatic linear alcohol having 1 to 4 carbon atoms. In order to efficiently remove water which easily becomes a cause of secondary agglomeration in the vacuum drying step, it is also a preferable embodiment that an organic solvent azeotropic with water such as n-butanol is allowed to coexist.

The slurry to be subjected to the vacuum drying step has a content of the silica particles of preferably 5% by mass or more and 40% by mass or less, and more preferably 10% by mass or more and 30% by mass or less in 100% by mass of the slurry. If the content of the silica particles is 5% by mass or more, the solvent component to be gasified or evaporated is in a low amount, and therefore, the length of the above-mentioned heating tube can be short or the inner diameter of the heating tube can be widened and it is advantageous in terms of prevention of Fe contamination. Further if the silica content is 40% by mass or less, the heating tube is prevented from clogging with the silica particles.

As the vacuum drying apparatus, an apparatus is employed having a heating tube which is externally heated, where one end of which is connected to a supply part of a raw material slurry and the other end is connected to a powder collecting chamber retained in reduced pressure. The slurry is heated while being transported in the inside of the heating tube retained in reduced pressure, and a portion or all the solvent in the slurry is volatilized, and at the same time, the silica particles are collected in the powder collecting chamber retained in reduced pressure, and in the case where the solvent remains, the drying treatment is further carried out.

As described above, the present inventors have found that Fe contained in silica is contaminated in the vacuum drying step. That is, during the time the slurry is transported in the inside of a heating tube made of stainless steel, silica particles with high hardness come into collision against the wall of the heating tube and the silica particles scratch the stainless steel from the heating tube, and thus the silica particles are contaminated with Fe at the time of being collected in the collecting chamber.

In the present invention, a decrease in frequency of the collision of the silica particles against the wall of the heating tube and a decrease in Fe content have been successful by using a vacuum heating apparatus with the following configuration and carrying out the vacuum drying in the following conditions.

In the vacuum drying apparatus to be used in the present invention, the heating tube is configured by alternately joining straight tubes and elbows. The number of the straight tubes configuring the heating tube is preferably 2 or more and 10 or less. If the number of the straight tubes configuring the heating tube is 10 or less and the number of the elbows is 9 or less, the length of the heating tube as a whole becomes short and the probability of collision of the powder against the inner wall of the heating tube or the elbow is lowered, so that the Fe content in the powder can be further lowered, and this is a preferable embodiment of the present invention. The number of the straight tubes is preferably 2 or more and 4 or less. The number of the elbows to be used is preferably (n−1), in the case where the number of the straight tubes is n. If the heating tube is configured by only straight tubes, an external heating means for heating the heating tube needs to be long; however, the heating tube is made into a meandering state by alternately joining the straight tubes and the elbows, so that the vacuum drying apparatus can be made compact. The end parts of the elbows may be extended in a straight tube state. The heating tube is preferably configured by 3 or less of the straight tubes and 2 or less of the elbows, and most preferably 2 straight tubes and 1 elbow.

The ratio (length/inner diameter) of the length (mm) of the heating tube to the inner diameter (mm) of the heating tube is suppressed to 1200 times or less. It is because if the length exceeds 1200 times to the inner diameter of the heating tube, the Fe content of the powder tends to be high. The ratio (length/inner diameter) is more preferably 400 times or less, even more preferably 300 times or less, and particularly preferably 250 times or less. The lower limit of the ratio (length/inner diameter) is not particularly limited; however, it is preferably 100 times or more in terms of heating efficiency. Specifically, for example, in the case where a heating tube having an inner diameter of 8 mm is used, the full length of the heating tube is preferably 800 mm or longer and 9600 mm or shorter. The length of the inner wall in the outer circumference side is employed for the length of the elbow. The inner diameter of the heating tube is made such that the inner diameter of the straight tube part is not different from that of the elbow part.

The inner diameter of the heating tube is preferably 8 mm or longer. The inner diameter of the heating tube exceeds more preferably 8 mm, and specifically, even more preferably 9 mm or longer and particularly preferably 10 mm or longer. The upper limit of the inner diameter is not particularly limited; however, it is preferably 20 mm or shorter in order to avoid enlargement of the apparatus.

The length of one straight tube configuring the heating tube is not particularly limited; however, it is preferably 400 mm or longer and 1500 mm or shorter, and more preferably 600 mm or longer and 1200 mm or shorter. If it is shorter than 400 mm, the solvent evaporation in the heating tube becomes insufficient, and the agglomeration prevention effect, which is an advantageous point of drying in a static state (drying in a collecting chamber), may possibly become insufficient. On the other hand, if the length exceeds 1500 mm, in the case where agglomeration of fine particles proceeds in the straight tubes, the interparticle agglomeration force is increased, and therefore, it may possible become impossible to carry out cracking to primary particles by the cracking force due to collision in the elbow parts.

A material configuring the vacuum drying apparatus such as the heating tube or the silica particle collecting chamber is preferably SUS 304 or SUS 316 (JIS G 4305). In order to lower the Fe content, SUS 316 is more effective.

Examples of a process for joining the straight tubes and the elbows in the heating tube include a process for providing flanges having screw holes in the straight tubes and the elbows and fixing the flanges with bolts and nuts; a process for forming screw holds in the end parts of the straight tubes and elbows and fixing the straight tubes and the elbows with joints and nuts; and a process for providing coupler-type joints in the end parts of the straight tubes and elbows and joining and fixing the straight tubes and the elbows.

In the present invention, the slurry is supplied to the heating tube from the supply part. The supply rate is preferably in a range of 1 L/hour or more and 50 L/hour or less. If the supply rate is less than 1 L/hour, the drying step is non-effective and if it exceeds 50 L/hour, the impact at the time when the particles collide against the inner wall of the heating tube becomes high, and the effect of decreasing the Fe content may possibly become insufficient even if the present invention is employed. The lower limit of the supply rate is more preferably 13 L/hour, and even more preferably 14 L/hour. The upper limit of the supply rate is more preferably 18 L/hour, even more preferably 17 L/hour, and most preferably 16 L/hour. The raw material slurry may be supplied using a conventionally known means such as a pump.

The heating tube is preferable to be heated at about 150° C. or higher and 200° C. or lower by, for example, an external heating means such as a jacket in which hot steam or a heat medium can pass. Superheated steam is preferable as the heating medium. In addition, the heating temperature may properly be changed in accordance with the boiling point of the solvent of the raw material slurry.

The pressure in the inside of the heating tube and the pressure in the inside of the powder collecting chamber are preferably about 6 kPa or higher and 27 kPa or lower (gauge pressure). Since even a solvent having a high boiling point in normal pressure is evaporated at low temperature by reducing the pressure, the drying is promoted efficiently. It is preferable to install, for example, a silica particle recovery means such as a bag filter, in the powder collecting chamber to separate the gas generated by evaporation of the solvent and the silica particles of interest. The temperature of the powder collecting chamber is not particularly limited, and it is preferable to heat the powder collecting chamber to about 150° C. or higher and 200° C. or lower by an external heating means similarly to the case of the heating tube for removing the remaining solvent.

2-3. Firing Step

The powdered silica particles through the vacuum drying step are subjected to a firing step. The firing step is a step of firing silica particles at 800° C. or higher and 1200° C. or lower. In this step, hydrophilic silanol groups and alkoxysilyl groups possessed by the silica particles are condensed to form siloxane bonds, and at the same time, the fine pores are closed to give silica particles with low hygroscopicity (saturated moisture content). If the firing temperature is lower than 800° C., the silanol groups may possibly remain even if the firing is carried out for a long time. Silica particles synthesized by an alkoxide method generally have a large quantity of alkoxysilyl groups and these alkoxysilyl groups are eliminated by heating treatment at 300° C. or higher and 600° C. or lower (dealcoholization); however, since condensation reaction of silanol groups is insufficient, a large number of fine pores are formed in the silica particle surface. Therefore, if the firing temperature is lower than 800° C., fine pores remain in the particle surface and water is easily condensed in the fine pores, and therefore, the silica particles have relatively high hygroscopicity. On the other hand, if the firing temperature exceeds 1200° C., fusion of the silica particles occurs and secondary agglomerates which are impossible to be pulverized even by a pulverization machine are produced, and thus it is not preferable. Further, in the case where the content of coarse particles is adjusted to the content that is the same as in the case of firing at 1200° C. or lower, it is required to carry out pulverization with high impact force, and thus the amount of Fe to be contaminated tends to be high. If the firing temperature is 1200° C. or lower, the secondarily agglomerated silica particles produced by the firing are easily pulverized to primary particles with weak pulverization force, so that even if a pulverization apparatus having a member containing Fe is used for pulverization, contamination with Fe can be further suppressed. In the case where it is aimed to lower the saturated moisture content, the upper limit of the firing temperature may be 1250° C.; however, in this case, the content of coarse particles tends to be increased. The firing time is sufficient if it is about 1 hour, and it may be properly set in accordance with the firing temperature, the particle diameter of the silica particle, and the like. The ambient gas for the firing step may be air. If the firing is carried out in the above-mentioned conditions (800° C. or higher and 1200° C. or lower), amorphous silica having a saturated moisture content lowered to 1% by mass or less and a Fe content of 20 ppm or less can be obtained. Moreover, the content of coarse particles is also controlled within the above-mentioned preferable range. In order to adjust the saturated moisture content to 0.2% by mass or less, the firing temperature is preferably 900° C. or higher; in order to adjust the saturated moisture content to 0.1% by mass or less, the firing temperature is preferably 950° C. or higher; and in order to adjust the saturated moisture content to 0.05% by mass or less, the firing temperature is preferably 1000° C. or higher.

After the firing, it is preferable that the secondarily agglomerated particles are pulverized to primary particles by a conventional pulverization machine or a cracking machine. A pulverization process is not particularly limited, and may be carried out using high-speed rotation mills such as a hammer mill, a screen mill, and a disk pin mill; classifier-built-in type high speed rotation mills such as a turbo mill and a Cosmomizer; gas current type pulverization machines such as a counter jet mill and a jet mill; or the like. If the firing is carried out in the above-mentioned firing temperature range (800° C. or higher and 1200° C. or lower), pulverization to primary particles can be carried out even under a mild pulverization condition, and thus Fe contamination during the pulverization can be suppressed. In terms of the configuration of the pulverization machine, it is preferable to select a material containing no Fe (e.g., ceramic, glass, and metals other than Fe) for parts where impact is applied to the particles. The amorphous silica after the pulverization may be classified.

Further, the particles are subjected to pulverization treatment after firing. In this case, an aspect involving surface-treatment with a silane coupling agent before the pulverization treatment; or an aspect involving pulverization treatment in the presence of a silane coupling agent is preferable, and the latter aspect is particularly preferable. Since the particle surface is covered with organic groups possessed by the silane coupling agent due to the surface-treatment with the silane coupling agent or the pulverization in the co-presence of the silane coupling agent, contamination with Fe can be further suppressed even if a pulverization apparatus having a member containing Fe is used for the pulverization. The surface treatment with the silane coupling agent may be carried out by heating the fired amorphous silica particles being mixed with the silane coupling agent, or by applying energy of the pulverization treatment in the state where both are mixed. At the time of mixing the amorphous silica particles and the silane coupling agent, an organic solvent may be used.

3. Use

The amorphous silica of the present invention can be used as a filler for curable resin compositions. As described above, since the amorphous silica of the present invention has a very low content of a Fe content of 20 ppm or less and no colorization, it can be preferably used as a filler for curable resin compositions configuring a light-permeable member.

The amorphous silica of the present invention can be preferably used as a filler for curable resin compositions containing, in particular, an epoxy resin as a resin component. In the case where the amorphous silica is used for an epoxy-based curable resin composition, the durability of a cured product can be also improved in addition to the effect of suppressing coloration.

In the epoxy-based resin composition, the reason for the improvement in durability of a cured product is not necessarily made clear; however, it is supposed as follows. An epoxy-based resin composition generally includes acid anhydrides such as maleic anhydride; novolac type resins such as phenol novolac and cresol novolac; and amines such as meta-phenylenediamine as a curing agent. It is supposed that if Fe ions are present at the time when an epoxy resin is cured using those curing agents, curing is inhibited as follows. Specifically, in the case of using an acid anhydride as a curing agent in combination with an amine-based curing accelerator such as an imidazole compound, the amine-based curing accelerator is coordinated with the acid anhydride to generate a carboxyl anion (—COO—), and the Fe ions are adsorbed to the anion, and therefore, reaction with the epoxy group is not promoted and the curing reaction is inhibited. In the case of a novolac type resin, the novolac type resin is coordinated with the Fe ions and the curing reaction is inhibited. In the case of amines, the amines are coordinated with an epoxy compound to generate a (=CH—O—) anion, and the Fe ions are adsorbed to the anion, and therefore, reaction with the epoxy group is not promoted and the curing reaction is inhibited. Consequently, it is supposed that in the case where silica with a high Fe content is used as a filler, curing becomes insufficient in the interface of the silica particle surface and the resin, and even after the curing, the strength of the cured product cannot be developed enough or water permeated through the resin is stagnated in the insufficiently cured interface part to result in a decrease in strength with the lapse of time. In contrast, the amorphous silica of the present invention has a very low Fe content, and there is no probability of inhibition of curing reaction as described above, and thus the durability of a cured product can be improved.

An epoxy-based resin composition is generally used while being mixed with a curing agent immediately before use. There is a case where a cation curing catalyst such as a thermally latent curing catalyst or a photo-latent curing catalyst is used in place of the curing agent, and in such a case, the epoxy-based resin composition may be stored in the state of containing the cation curing catalyst. In any case, it is important that the resin composition is stable in fluidity for assuring moldability and viscosity characteristics at the time of storage. If the amorphous silica of the present invention is used, the fluidity of the epoxy-based resin composition and its stability with the lapse of time can be improved.

In the epoxy-based resin composition, the reason for the improvement in fluidity and stability with the lapse of time is not necessarily made clear; however, it is supposed as follows. That is, Fe that is present in the surface (near the surface) of the amorphous silica can be present in various forms, for example, ion state (solid-solution or adsorption) or metal state comprised of a plurality of Fe atoms, and it is supposed that Fe is stabilized and present in a hydroxyl-containing form (Fe—OH) (including a form that is present as fine iron hydroxide) by reaction with oxygen and water in air. Since the hydroxyl group has an acid-base property different from a silanol group, it exhibits an action of catalyzing ring-opening and polymerization reaction of the epoxy group (oxirane ring). As a result, even during the storage, the polymerization reaction of the epoxy compound is promoted in the composition to be thickened, and in the worst case, gelation is caused. In contrast, since the amorphous silica of the present invention has a very low Fe content and thus has Fe—OH in a small quantity as described above, the fluidity and the stability with the lapse of time is improved. Further, the above-described effect based on the difference of the Fe content becomes more significant in the case where an epoxy compound with high curing reactivity such as a hydrogenated epoxy compound or an alicyclic epoxy compound is used as the epoxy compound.

The amorphous silica of the present invention is preferably used for a sealing material. As described above, since the amorphous silica of the present invention has a very low content of a Fe content of 20 ppm or less and no colorization, it can be preferably used for a member through which light is directly transmitted such as an LED sealing material or a liquid crystal sealing material, or a peripheral member through which light is transmitted.

Further, use of the amorphous silica of the present invention for an epoxy resin-based sealing material makes it possible to sufficiently carry out curing of the epoxy resin without any probability of inhibition of curing reaction by a curing agent as described above. Therefore, if the amorphous silica of the present invention is used for an epoxy resin-based sealing material, the curing reaction is sufficiently promoted in the interface of the silica particle surface and the epoxy resin component, and the strength of a cured product is improved after the curing. Further, since the curing reaction in the interface part is sufficiently promoted, water which permeates in the resin is not stagnated in the interface part, and a decrease in strength with the lapse time can be suppressed, and thus the reliability of the sealing material is improved. As described above, a curable resin composition obtained by using the amorphous silica of the present invention is excellent in stability with the lapse of time and provided with improved fluidity, and therefore, it becomes excellent in replicability (ability to replicate a die configuration) at the time of die molding and in permeability into micro-spaces as described below. Moreover, since an epoxy compound with high curing reactivity can be used as a resin component, a cured product (a sealing material) excellent in mechanical strength and low hygroscopicity can be obtained with high productivity.

As described above, as use of the amorphous silica of the present invention, the sealing material to be used for mounting a semiconductor, or for an LED sealing material, a liquid crystal sealing material, or the like is a preferable embodiment for exhibiting the effect of the present invention, and particularly, an epoxy resin-based sealing material containing an epoxy resin as a sealing resin component is a preferable embodiment. Not limited to the use for a sealing material, an epoxy resin composition containing the amorphous silica of the present invention and an epoxy resin as a resin component is also a preferable embodiment of the present invention. The effect of the present invention is further significant in the case of an embodiment containing a hydrogenated epoxy compound and/or an alicyclic epoxy compound as an epoxy resin component.

The amorphous silica of the present invention is preferably used as an underfill encapsulant particularly among the sealing materials. Among the sealing materials, an underfill encapsulant refers to a curable resin composition to be poured into gaps of an object material to be sealed (e.g., a gap between a semiconductor chip and a substrate and a gap among solder balls). Such an underfill encapsulant is required to have performance as follows: that is, the underfill encapsulant sufficiently permeates into fine gaps of an object material to be sealed; the underfill encapsulant is sufficiently cured to assure the connection reliability against physical stress; the underfill encapsulant has favorable insulation; and the like. As described above, since the amorphous silica of the present invention has a very low Fe content, it can give a sealing composition with favorable fluidity and sufficient curability when it is mixed with a resin component. Consequently, use of the amorphous silica of the present invention gives an underfill encapsulant having favorable permeability in gaps of an object to be sealed and favorable connection reliability to physical stress. Further, since the amorphous silica of the present invention has very low saturated hygroscopicity, it gives a sealing material with favorable insulation, suppresses deterioration of a conductive material with water, and makes long time connection reliability.

Further, recently, in mounting of an underfill encapsulant, it has been tried to advance high density mounting, micro-wiring, and narrowing of gaps, and along with this situation, silica to be contained in a sealing material is required to be fine particles and to have a narrow particle size distribution. The amorphous silica of the present invention has a limited particle size distribution, a low variation coefficient of the particle diameter, and an extremely low content of coarse particles such as agglomerates. Therefore, the amorphous silica of the present invention and the curable resin composition containing the silica can be preferably used for mounting an underfill encapsulant such as high density mounting as described above. Particularly, in the case where the average spherical ratio is low (close to 1), angular parts are further lessened in the amorphous silica particle surface, so that a conducive material is prevented from being damaged and the connection reliability is improved.

Further, owing to micro-wiring, the contact surface area of the sealing material and the conductive material becomes wider, and therefore, in the case where the content of Fe having magnetism is high, the adverse effect of Fe on the conduction characteristic may possibly become further serious. However, since the amorphous silica of the present invention has a very low Fe content, the adverse effect on the conduction characteristic becomes very slight. If the coarse particles of agglomerates of amorphous silica are contained in a resin component, even in the case where the Fe contained in the respective particles is in a slight amount, the Fe bleeds with the lapse of time to form a bulk mass and may possibly generate intense magnetism. However, the amorphous silica of the present invention has a very low content of coarse particles such as agglomerates, and Fe is prevented from becoming coarse.

Further, particularly, amorphous silica containing few isolated silanol groups or no isolated silanol group is prevented from forming secondary agglomeration of silica particles during the preparation of a curable resin composition such as an underfill encapsulant. Further, amorphous silica has silanol groups derived from adsorbed water, the surface thereof can be uniformly treated with a silane coupling agent. Therefore, since such amorphous silica is excellent in dispersibility in a resin composition, a curable resin composition or a cured product in which the amorphous silica is uniformly dispersed can be obtained, and for example, in the case where the amorphous silica is used for a sealing material, there scarcely occurs a problem of damaging wiring or the like.

4. Underfill Encapsulant

As one example of use of the amorphous silica of the present invention, an underfill encapsulant will be described. The underfill encapsulant of the present invention has a characteristic of containing the above-mentioned amorphous silica and a resin. The resins described below as resins used for an underfill encapsulant can be used not only for an underfill encapsulant, but also for various kinds of sealing materials for electronic parts, such as a sealing material for semiconductors, a sealing material for liquid crystals, and a sealing material for LED devices.

The content of the amorphous silica in the underfill encapsulant is preferably 50 parts by mass or more (more preferably 80 parts by mass or more, and even more preferably 100 parts by mass or more) and 250 parts by mass or less (more preferably 220 parts by mass or less, and even more preferably 200 parts by mass or less) based on 100 parts by mass of the resin component.

Examples of the resin include an epoxy resin, a silicone resin, a polyimide resin, and a polyamide resin. These resins may be used alone or two or more thereof may be used in combination. Among them, since the effect of use of the amorphous silica of the present invention is significant as described above, an epoxy resin is preferable. That is, the underfill encapsulant of the present invention is preferably an epoxy resin-based underfill encapsulant containing amorphous silica and an epoxy resin.

Examples of the epoxy resin include an aromatic epoxy compound, an aliphatic epoxy compound, an alicyclic epoxy compound, and a hydrogenated epoxy compound. Among them, in terms of easiness of obtaining a cured product (sealing) excellent in heat resistance and light fastness, an alicyclic epoxy compound and a hydrogenated epoxy compound are preferable.

The aromatic epoxy resin is a compound having an aromatic ring and an epoxy group in the molecule. Preferable examples of the aromatic epoxy compound include glycidyl compounds having aromatic ring conjugated systems of a bisphenol skeleton, a fluorene skeleton, a biphenyl skeleton, a naphthalene ring, an anthracene ring, and the like. Specifically, a bisphenol A type epoxy compound, a bisphenol F type epoxy compound, a fluorene-based epoxy compound, an aromatic epoxy compound having a bromo substituent and the like are preferable, and a bisphenol A type epoxy compound and a bisphenol F type epoxy compound are more preferable.

Preferable examples of the aromatic epoxy compound also include aromatic glycidyl ether compounds. Examples of the aromatic glycidyl ether compound include an epi-bis type glycidyl ether type epoxy resin, a high molecular weight epi-bis type glycidyl ether type epoxy resin, and a novolac-aralkyl type glycidyl ether type epoxy resin.

Preferable examples of the aliphatic epoxy compound include aliphatic glycidyl ether type epoxy resins. Examples of the aliphatic glycidyl ether type epoxy resin include those obtained by condensation reaction of polyol compounds and epihalohydrin. Examples of the polyol compound include ethylene glycol, diethylene glycol, triethylene glycol, tetraethylene glycol, polyethylene glycol (PEG600), propylene glycol, dipropylene glycol, tripropylene glycol, tetrapropylene glycol, polypropylene glycol (PPG), glycerol, diglycerol, tetraglycerol, polyglycerol, trimethylolpropane and its multimer, pentaerythritol and its multimer, and mono-/polysaccharides such as glucose, fructose, lactose, and maltose, and those having a propylene glycol skeleton, an alkylene skeleton, and an oxyalkylene skeleton are preferable. Preferable examples of the aliphatic glycidyl ether type epoxy resin include aliphatic glycidyl ether type epoxy resins having a propylene glycol skeleton, an alkylene skeleton, and an oxyalkylene skeleton for the center skeleton.

The alicyclic epoxy compound is a compound having an alicyclic epoxy group. Examples of the alicyclic epoxy group include epoxy groups added directly or through hydrocarbons to epoxycyclohexane groups (epoxycyclohexane skeleton) and alicyclic hydrocarbons.

Examples of the alicyclic epoxy compound include epoxy compounds containing an epoxycyclohexane group such as 3,4-epoxycyclohexylmethyl-3',4'-epoxycyclohexane carboxylate, epsilon-caprolacton modified 3,4-epoxycyclohexylmethyl-3',4'-epoxycyclohexane carboxylate, and bis(3,4-epoxycyclohexyl) adipate; epoxy resins containing a heteroring such as 1,2-epoxy-4-(2-oxiranyl)cyclohexane adduct of 2,2-bis(hydroxymethyl)-1-butanol and triglycidyl isocyanurate; and the like. Among them, compounds having epoxycyclohexane group are preferable. In terms of increasing the curing rate, polyfunctional alicyclic epoxy compounds having two or more alicyclic epoxy groups in the molecule are preferable. Further, compounds having one alicyclic epoxy group and an unsaturated double bond group such as a vinyl group are also preferably used.

The hydrogenated epoxy compound is a compound obtained by hydrogenating (reducing) the unsaturated bond of a compound having an unsaturated bond and an epoxy group in the molecule. Preferable examples of the hydrogenated epoxy compound include compounds having a glycidyl ether group directly or indirectly bonded to the saturated alicyclic hydrocarbon skeleton, and suitable examples thereof include polyfunctional glycidyl ether compounds. Further, the hydrogenated epoxy compound is preferably a completely or partially hydrogenated compound of an aromatic epoxy compound, more preferably a hydrogenated compound of an aromatic glycidyl ether compound, and furthermore preferably a hydrogenated compound of an aromatic polyfunctional glycidyl ether compound. Specific examples thereof include hydrogenated compounds of a bisphenol A type epoxy compound, a bisphenol S type epoxy compound, and a bisphenol F type epoxy compound, that is, a hydrogenated bisphenol A type epoxy compound, a hydrogenated bisphenol S type epoxy compound, and a hydrogenated bisphenol F type epoxy compound. A hydrogenated bisphenol A type epoxy compound and a hydrogenated bisphenol F type epoxy compound are more preferable.

In the epoxy resin-based underfill encapsulant, conventionally known curing agents for an epoxy resin can be used for curing the epoxy resin, a resin component. Examples of the curing agent to be used include acid anhydrides such as maleic anhydride; novolac type resins such as phenol novolac and cresol novolac; and amines such as m-phenylenediamine.

In the epoxy resin-based underfill encapsulant, an embodiment containing a cationic curing catalyst in place of the above-mentioned addition type curing agent is also preferable. Examples of the cationic curing catalyst to be used include conventionally known thermal cationic curing catalyst and photo-cationic curing catalyst.

The thermal cationic curing catalyst is also referred to as a thermal acid generator or a thermal cationic polymerization initiator, and exhibits a substantial function as a curing agent in a curable resin composition when it becomes the curing temperature. Preferable examples of the thermal cationic curing catalyst include compounds represented by the following general formula (1):

$$(R^1_a R^2_b R^3_c R^4 d_Z)^{+s}(AXt)^{-s} \quad (1)$$

wherein, Z represents at least one element selected from the group consisting of S, Se, Te, P, As, Sb, Bi, O, N, and a halogen atom; $R^1$, $R^2$, $R^3$, and $R^4$ are the same or different and represent organic groups; a, b, c, and d are 0 or a positive number and the total of a, b, c, and d is equal to the valence of Z; cation $(R^1_a R^2_b R^3_c R^4 d_Z)^{+s}$ is an onium salt; A represents a metal element or a metalloid, a center atom of the halide complex, and is at least one selected from the group consisting of B, P, As, Sb, Al, Ca, In, Ti, Zn, Sc, V, Cr, Mn, and Co; X is a halogen element; s is the net electric charge of halide complex ion; and t is a number of halogen elements of halide complex ion.

Specific examples of the anion $(AXt)^{-s}$ in the general formula (1) include tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$). Further, an anion represented by the general formula AXt (OH)$^-$ can be also used. Examples of the other anion include perchlorate ion ($ClO_4^-$), trifluoromethylsulfite ion ($CF_3SO_3^-$), fluorosulfonate ion ($FSO_3^-$), toluenesulfonate ion, and trinitrobenzenesulfonate ion.

Specific examples of the products of the thermal cationic curing catalyst include diazonium salt type products such as AMERICURE series (manufactured by American Can Company), ULTRASET series (manufactured by ADEKA CORPORATION), and WPAG series (manufactured by Wako Pure Chemical Industries, Ltd.); Iodonium salt type products such as UVE series (manufactured from General Electric Company), FC series (manufactured by 3M), UV 9310 C (manufactured by GE Toshiba Silicones Co., Ltd.), Photoinitiator 2074 (manufactured by Rhone-Poulenc), and WPI series (manufactured by Wako Pure Chemical Industries, Ltd.); and sulfonium salt type products such as CYRACURE series (manufactured by Union Carbide Corporation), UVI series (manufactured by General Electric Company), FC series (manufactured by 3M), CD series (manufactured by Sartomer Company, Inc.), Optomer SP series and Optomer CP series (manufactured by ADEKA CORPORATION), San-Aid SI series (manufactured by Sanshin Chemical Industry Co., Ltd.), CI series (Nippon Soda Co., Ltd.), WPAG series (manufactured by Wako Pure Chemical Industries, Ltd.), and CPI series (manufactured by San Apro Ltd.). Among the products, sulfonium salt type products are preferable in terms of curing at a relatively low temperature.

The photo-cationic curing catalyst is also referred to as an optical acid generator or an optical cationic polymerization initiator, and exhibits a substantial function as a curing agent by light irradiation. Suitable examples of the photo-cationic curing catalyst include triphenylsulfonium hexafluoroantimonate, triphenylsulfonium hexafluorophosphate, p-(phenylthio)phenyldiphenylsulfonium hexafluoroantimonate, p-(phenylthio)phenyldiphenylsulfonium hexafluorophosphate, 4-chlorophenyldiphenylsulfonium hexafluorophosphate, 4-chlorophenyldiphenylsulfoniumhexafluoroantimonate, bis [4-(diphenylsulfonio)phenyl]sulfide bishexafluorophosphate, bis [4-(diphenylsulfonio)phenyl] sulfide bishexafluoroantimonate, (2,4-cyclopentadien-1-yl) [(1-methylethyl)benzene]-Fe-hexafluorophosphate, and diallyliodonium hexafluoroantimonate.

Specific examples of the products of the thermal cationic curing catalyst include preferably diazonium salt type, iodonium salt type, and sulfonium salt type products such as UVI-6950, UVI-6970, UVI-6974, and UVI-6990 (manufactured by Union Carbide Corporation); Adeca Optomer SP-150, SP-151, SP-170, and SP-172 (manufactured by ADEKA CORPORATION); Irgacure 250 (manufactured by Ciba Japan); CI-2481, CI-2624, CI-2639, and CI-2064 (manufactured by Nippon Soda Co., Ltd.); CD-1010, CD-1011, and CD-1012 (manufactured by Sartomer Company Inc.); DTS-102, DTS-103, NAT-103, NDS-103, TPS-103, MDS-103, MPI-103, and BBI-103 (manufactured by Midori Kagaku Co., Ltd.); PCI-061T, PCI-062T, PCI-020T, and PCI-022T (manufactured by Nippon Kayaku Co., Ltd.); CPI-100P, CPI-101A, and CPI-200K (manufactured by San-Apro Ltd.); San-Aid SI-60L, San-Aid SI-80L, San-Aid SI-100L, San-Aid SI-110L, San-Aid SI-145, San-Aid SI-150, San-Aid SI-160, and San-Aid SI-180L (manufactured by Sanshin Chemical Industry Co., Ltd.); and WPAG series (manufactured by Wako Pure Chemical Industries, Ltd.).

The underfill encapsulant may contain, other than the amorphous silica and the resin, an antioxidant, a reactive diluent, a saturated compound having no unsaturated bond, a pigment, a dye, an antioxidant, an ultraviolet absorbent, a light stabilizer, a plasticizer, a non-reactive compound, a chain transferring agent, a thermal polymerization initiator, an anaerobic polymerization initiator, a polymerization inhibitor, an inorganic filler and organic filler, an adhesion improver such as a coupling agent, a thermal stabilizer, an antibacterial and antifungal agent, a flame retardant, a delustering agent, a defoaming agent, a leveling agent, a wet dispersant, a precipitation prevention agent, a thickener and a dripping prevention agent, a color separation prevention agent, an emulsifier, a slip and scratch prevention agent, a skin-covering prevention agent, a drying agent, an antifouling agent, an antistatic agent, a conductive agent (an electrostatic aid), and the like.

EXAMPLES

Hereinafter, the present invention will be described with reference to examples; however, the following examples do not limit the present invention and alterations and modifications within the scope of the invention are all included in the invention.

[Method of Measuring Fe Content]

The measurement was carried out using an induction coupled high-frequency plasma emission spectroscopic analyzer (ICP-AES SPS 3500; manufactured by Seiko Instruments Inc.) by induction coupled high-frequency plasma emission spectrometry (ICP process). Specifically, a silica particle sample (5 g) was added to a mixed solution of hydrofluoric acid and nitric acid, followed by mixing, and to the mixed solution were added successively nitric acid and aqueous hydrogen peroxide to adjust the total amount of 50 mL, and the obtained solution as a measurement sample solution was subjected to the measurement.

[Saturated Moisture Content]

The moisture content of fired silica particles means a water content (mass increase) contained in silica particles obtained after dried-state silica particles are left in an environment of 30° C. and 90% RH (relative humidity) for 1 day. The measurement of the moisture content was carried out using silica particles having a water content of 0.5% or less. As pretreatment therefor, 5 g of silica particles were spread uniformly and thinly on an aluminum cup and dried at 110° C. for 1 hour to remove water. The fired silica particles used in examples described below had a water content of 0.3%. The measurement of the saturated moisture content of fired silica particles are carried out by, first, measuring the mass of the silica particles before the moisture absorption test. Next, 5 g of the silica particles are put on a watch glass having a diameter of 10 cm and uniformly and thinly spread by lightly tapping the bottom of the watch glass. Thereafter, the silica particles are left in the above-mentioned environment for 1 day to absorb moisture (execution of the moisture absorption test). Next, the mass of the silica particles after the moisture absorption test is measured. Even if the moisture absorption test is continued for 2 to 3 days, the moisture absorption content of the silica particles of the present invention is not substantially increased. This is also a preferable physical property to be exerted by the amorphous silica particles of the present invention. According to the following equation, the moisture content of fired silica particles is measured.

100×{mass of silica particles after moisture absorption test (g)−mass of silica particles before moisture absorption test (g)}/mass of silica particles after moisture absorption test (g)=saturated moisture content of silica particles (% by mass).

In the present invention, 10 pieces of the watch glass were made ready and the moisture absorption content of the silica particles was measured at one time in the same condition. The number of times for measurement was set to 10 times, and the average value of the moisture absorption content of the silica particles was calculated, and the value was defined as the saturated moisture absorption content.

[Method of Measuring Average Particle Diameter]

Silica particles arbitrarily sampled are photographed by a scanning electron microscope. The measurement magnification is set in such a manner that there are 50 to 100 particles in a visual field of one photograph. For example, in the case of silica particles having an average particle diameter of 1 µm, a photograph may be taken at 10000 magnifications. The diameter for arbitrary particles in the photograph taken in this manner was measured by a vernier micrometer, and the number average value thereof was calculated.

Further, the standard deviation of the particle diameter was calculated according to the following equation, and the variation coefficient of the particle diameter was calculated according to the following equation.

Standard deviation of particle diameter [Equation 1]

$$(\sigma) = \frac{\sum_{i=1}^{n} |D_{ave} - D_i|}{n-1} \times D_{ave}$$

Variation coefficient $$(CV) = \frac{\sigma}{D_{ave}}$$

D: Particle diameter
$D_{ave}$: Average particle diameter

[Average Spherical Ratio]

Similarly to the case of the average particle diameter, a scanning electron microscopic photograph was taken and the major axis and the minor axis of one particle were measured, and a spherical ratio (major axis/minor axis) was calculated. The same measurement was carried out for 100 particles and the average value was calculated.

[Content of Coarse Particles]

After amorphous silica particles (mass W1) were dispersed in a water/methanol mixed solvent (mass ratio 50:50), the dispersion was allowed to pass through a sieve with a known mass and an opening of 20 μm. The particles remaining on the sieve were dried together with the sieve, and thereafter the total mass was measured, and the mass of the sieve was subtracted therefrom to calculate the mass (W2) of coarse particles. The content of the coarse particles was calculated according to the following equation.

Content of coarse particles (% by mass)=100×W2/W1

[Infrared Absorption Spectrum]

Using a Fourier transform infrared spectrophotometer (EXCALBUR SERIES, manufactured by Varian Technologies Japan Ltd.), measurement was carried out in a range of 650 cm$^{-1}$ or more and 4000 cm$^{-1}$ or less by a KBr process. In the infrared absorption spectrum obtained by the measurement, the peak absorbance attributed to each of a silanol group derived from adsorbed water, an isolated silanol group, and a siloxane bond was measured, and the respective ratios as described below were calculated. The attribution and position (wavelength) of the respective peaks are as described above.

The ratio ($A_1/A_0$) of the maximum absorbance ($A_0$) of the peak of siloxane bond and the maximum absorbance ($A_1$) of the peak of isolated silanol group The ratio ($A_2/A_0$) of the maximum absorbance ($A_0$) of the peak of siloxane bond and the maximum absorbance ($A_2$) of the peak of silanol group derived from adsorbed water The ratio ($A_1/A_2$) of the maximum absorbance ($A_1$) of the peak of isolated silanol group and the maximum absorbance ($A_2$) of the peak of silanol group derived from adsorbed water Comparative Example 1

A 20 L-capacity reactor made of glass and equipped with a stirrer, a titrator, and a thermometer was loaded with 770 parts by mass of methanol as an organic solvent and 268 parts by mass of 28% ammonia water (water and a catalyst), and in stirring condition, the liquid temperature was adjusted to 20±0.5° C. On the other hand, a solution obtained by dissolving 300 parts by mass of tetramethoxysilane as a silicon alkoxide in 128 parts by mass of methanol was loaded to the titrator. The solution was added dropwise from the titrator over 2 hours and on completion of the dropwise addition, the stirring was continued further for 1 hour to carry out hydrolytic polycondensation of tetramethoxysilane. A suspension of spherical silica particles having an average particle diameter of 1.5 μm was obtained. The silica particles in this suspension had a concentration of 8% by mass.

The obtained silica particle suspension was loaded to a round flask equipped with a stirrer and a condenser, followed by heating, and the solvent component and the ammonia were removed to prepare a raw material slurry containing 20% by mass of silica particles (concentration), 10% by mass of water, 1% by mass or less of ammonia, and balance methanol (about 70% by mass).

The raw material slurry was supplied at a supply rate of 20 L/hour to a heating tube made of SUS 304 and configured by joining eight straight tubes having an inner diameter of 8 mm and a length of 800 mm with seven 180 degree elbows having a length (the length of the inner wall part in the outer circumferential side) of 160 mm from a supply part of a vacuum drying apparatus equipped with the heating tube. The heating tube was heated with superheated steam by an external heating means to adjust the inner temperature of the heating tube to 175° C. The collecting chamber temperature was adjusted to 150° C. The inside of the heating tube and the inside of the collecting chamber were under a reduced pressure of 50 Torr (6.6 kPa).

The obtained dried silica particles were put in a crucible, fired at 1050° C. for 1 hour using an electric furnace, thereafter cooled, and pulverized to obtain fired amorphous silica (c1). The obtained fired silica had a Fe content of 44 ppm, an average particle diameter of 1.3 μm, and a saturated moisture content of 0.03% by mass.

Example 1

Fired amorphous silica (e1) was obtained in the same manner as in Comparative Example 1, except that the heating tube was made of SUS 304 and configured by joining straight two tubes having an inner diameter of 8 mm and a length of 800 mm with one 180 degree elbow having a length of 160 mm. The obtained fired silica had a Fe content of 14 ppm, an average particle diameter of 1.3 μm, and a saturated moisture content of 0.03% by mass.

Example 2

Fired amorphous silica (e2) was obtained in the same manner as in Example 1, except that the supply rate of the slurry was changed to 15 L/hour. The obtained fired silica had a Fe content of 6 ppm, an average particle diameter of 1.3 μm, and a saturated moisture content of 0.03% by mass.

Example 3

Fired amorphous silica (e3) was obtained in the same manner as in Example 1, except that the heating tube was made of SUS 316. The obtained fired silica had a Fe content of 10 ppm, an average particle diameter of 1.3 μm, and a saturated moisture content of 0.03% by mass.

Example 4

Fired amorphous silica (e4) was obtained in the same manner as in Example 3, except that the inner diameter of the heating tube was changed to 10 mm. The obtained fired silica had a Fe content of 1 ppm, an average particle diameter of 1.3 μm, and a saturated moisture content of 0.03% by mass.

Example 5

A raw material slurry containing 20% by mass of silica particles having an average particle diameter of 0.3 μm, 1% by mass or less of ammonia, 10% by mass of water, and balance methanol (about 70% by mass) was prepared in the same manner as in Comparative Example 1. Fired amorphous silica (e5) was obtained in the same manner as in Example 1, except that this slurry was used. The obtained fired silica had a Fe content of 3 ppm, an average particle diameter of 0.2 μm, and a saturated moisture content of 0.03% by mass.

Example 6

A raw material slurry containing 20% by mass of silica particles having an average particle diameter of 0.3 μm, 1% by mass or less of ammonia, 10% by mass of water, and balance methanol (about 70% by mass) was produced in the same manner as in Comparative Example 1. Fired amorphous silica (e6) was obtained in the same manner as in Comparative Example 1, except that this slurry was used and the inner diameter of the heating tube was changed to 10 mm. The obtained fired silica had a Fe content of 2 ppm, an average particle diameter of 0.2 µm, and a saturated moisture content of 0.03% by mass.

Comparative Example 2

A suspension of spherical silica particles having an average particle diameter of 1.5 µm was produced in the same manner as in Comparative Example 1. The obtained suspension was concentrated at 90° C. under reduced pressure using an evaporator to remove the solvent, and thus dried silica was obtained. The obtained dried silica was cracked by using a jet mill (Labojet, manufactured by Nippon Pneumatic Mfg. Co., Ltd.). The cracking condition was such that the treatment rate was set to 200 g/hour and the compressed drying air was set to 0.4 MPa. The dried silica particles after the cracking were put in a crucible, fired at 1050° C. for 1 hour using an electric furnace, thereafter cooled, and pulverized to obtain fired amorphous silica (c2).

Reference Example 1

Fired amorphous silica (r1) was obtained in the same manner as in Comparative Example 2, except that the cracking condition in Comparative Example 2 was changed such that the treatment rate was set to 50 g/hour and the compressed drying air was set to 0.2 MPa.

Example 7

A suspension of spherical silica particles having an average particle diameter of 0.5 µm was obtained in the same manner as in Comparative Example 1, except that the concentrations (loading amounts) of the respective components in the reaction solution were changed as shown in Table 1. The silica particles in this suspension had a concentration of 16% by mass. The obtained silica particle suspension was heated and the solvent component and the ammonia were removed to prepare a raw material slurry containing 20% by mass of silica particles (concentration), 10% by mass of water, 1% by mass or less of ammonia, and balance methanol (about 70% by mass). Fired amorphous silica (e7) was obtained by drying and firing the raw material slurry in the same manner as in Example 2, except that the heating tube of the vacuum drying apparatus was changed to the configuration of four straight tubes and three elbows.

Example 8

A suspension of silica particles having an average particle diameter of 0.5 µm was prepared in the same manner as in Example 7, and reaction was carried out as follows by using a slurry of the obtained suspension having a silica concentration of 16% by mass as a seed solution. A reactor was loaded with 110 parts by mass of the seed solution, 500 parts by mass of methanol, and 228 parts by mass of 28% by mass ammonia water (water and a catalyst), and in stirring condition, the liquid temperature was adjusted to 20±0.5° C. On the other hand, a solution obtained by dissolving 327 parts by mass of tetramethoxysilane in 327 parts by mass of methanol was added dropwise by the titrator over 2 hours, and on completion of the dropwise addition, the stirring was continued further for 1 hour to carry out hydrolytic polycondensation of tetramethoxysilane, and thus a suspension of spherical silica particles having an average particle diameter of 1.0 µm was obtained. The silica particles in this suspension had a concentration of 10% by mass.

The obtained silica particle suspension was heated and the solvent component and the ammonia were removed to prepare a raw material slurry containing 20% by mass of silica particles (concentration), 10% by mass of water, 1% by mass or less of ammonia, and balance methanol (about 70% by mass). Fired amorphous silica (e8) was obtained by drying and firing the raw material slurry in the same manner as in Example 2.

Example 9

A suspension of spherical silica particles having an average particle diameter of 1.2 µm was obtained in the same manner as in Comparative Example 1, except that the concentrations (loading amounts) of the respective components in the reaction solution were changed as shown in Table 1. The silica particles in this suspension had a concentration of 5% by mass. The obtained silica particle suspension was heated and the solvent component and the ammonia were removed to prepare a raw material slurry containing 20% by mass of silica particles (concentration), 10% by mass of water, 1% by mass or less of ammonia, and balance methanol (about 70% by mass). Fired amorphous silica (e9) was obtained by drying and firing the raw material slurry in the same manner as in Example 2.

Example 10

Fired amorphous silica (e10) was obtained in the same manner as in Example 2, except that the firing temperature was changed to 1250° C.

Example 11

After fired amorphous silica was obtained in the same manner as in Example 10, cracking treatment was carried out to the extent that the amount of the coarse particles in the obtained amorphous silica became about 0.03% by mass to obtain amorphous silica (e11).

Example 12

Fired amorphous silica (e12) was obtained in the same manner as in Example 7, except that the firing temperature was changed to 850° C.

Example 13

Fired amorphous silica (e13) was obtained in the same manner as in Example 8, except that the firing temperature was changed to 1150° C.

Example 14

A Henschel mixer apparatus was loaded with 1000 parts by mass of the amorphous silica (e1) obtained in Example 1, and in stirring condition, a solution obtained by dissolving 12 parts by mass of vinyltrimethoxysilane as a silane coupling agent in methanol (vinyltrimethoxysilane concentration: 30% by mass) was added. After the addition, the temperature was increased to 60° C. in a nitrogen gas atmosphere, and the reaction mixture was stirred for 5 hours while being heated and retained at 100° C., and thereafter cooled in stirred condition. During the heating and retention, nitrogen gas was flown in the apparatus and the volatile components such as solvent components are removed outside of the system, together with the nitrogen gas.

After cooling, the powder in the apparatus was collected to obtain surface-treated amorphous silica (e14).

Example 15

Surface-treated amorphous silica (e15) was obtained in the same manner as in Example 14, except that the amorphous silica was changed to the amorphous silica (e5) obtained in Example 5 and the silane coupling agent was changed to 12 parts by mass of hexamethyldisilazane.

Example 16

Surface-treated amorphous silica (e16) was obtained in the same manner as in Example 14, except that the amorphous silica was changed to the amorphous silica (e7) obtained in Example 7 and the silane coupling agent was changed to 35 parts by mass of 3-glycidoxypropyltrimethoxysilane.

Example 17

Surface-treated amorphous silica (e17) was obtained in the same manner as in Example 14, except that the amorphous silica was changed to the amorphous silica (e8) obtained in Example 8 and the silane coupling agent was changed to 20 parts by mass of 3-methacryloxypropylmethyldimethoxysilane.

Comparative Example 3

Surface-treated amorphous silica (c3) was obtained in the same manner as in Example 14, except that the amorphous silica was changed to the amorphous silica (c2) obtained in Comparative Example 2 and the silane coupling agent was changed to 12 parts by mass of vinyltrimethoxysilane.

Table 1 shows the production conditions of the examples, comparative examples, and reference example, and Table 2 shows the evaluation results of the obtained amorphous silicas.

TABLE 1

| | Hydrolytic-polycondensation step | | | | | | | | | | | |
|---|---|---|---|---|---|---|---|---|---|---|---|---|
| | reaction solution concentration of each component | | | drying step | | | | | | firing step | | |
| | | | | suspension average particle diameter (μm) | | | heating tube | | | | | |
| | silicon compound | water | NH₃ | | apparatus | supply rate of slurry (L/hr) | material | inner diameter (mm) | straight tube (piece) | knee bend (piece) | firing temperature (° C.) | pulverization after firing | surface-treatment silane coupling agent |
| Comparative Example 1 | 1.1 | 5.7 | 2.4 | 1.5 | specific vacuum drying apparatus | 20 | SUS304 | 8 | 8 | 7 | 1050 | mild | — |
| Example 1 | | | | | | 20 | SUS304 | 8 | 2 | 1 | | | |
| Example 2 | | | | | | 15 | SUS304 | 8 | 2 | 1 | | | |
| Example 3 | | | | | | 20 | SUS316 | 8 | 2 | 1 | | | |
| Example 4 | | | | | | 20 | SUS316 | 10 | 2 | 1 | | | |
| Example 5 | | | | 0.3 | | 20 | SUS304 | 8 | 2 | 1 | | | |
| Example 6 | | | | | | 20 | SUS304 | 10 | 8 | 7 | | | |
| Comparative Example 2 | 1.1 | 5.7 | 2.4 | 1.5 | drying under reduced pressure | — | — | — | — | — | 1050 | mild | — |
| Reference Example 1 | | | | | | — | — | — | — | — | | | |
| Example 7 | 2.3 | 3.3 | 1.4 | 0.5 | specific vacuum drying apparatus | 15 | SUS304 | 8 | 4 | 3 | 1050 | mild | — |
| Example 8 | 1.3 | 5.1 | 2.1 | 1.0 | | 15 | SUS304 | 8 | 2 | 1 | | | |
| Example 9 | 0.6 | 6.7 | 2.8 | 1.2 | | | | | | | | | |
| Example 10 | 1.1 | 5.7 | 2.4 | 1.5 | | | | | | | 1250 | mild | — |
| Example 11 | | | | | | | | | | | | hard | — |
| Example 12 | 2.3 | 3.3 | 1.4 | 0.5 | | | | | | | 850 | mild | — |
| Example 13 | 1.3 | 5.1 | 2.1 | 1.0 | | | | | | | 1150 | mild | — |
| Example 14 | 1.1 | 5.7 | 2.4 | 1.5 | specific vacuum drying apparatus | 20 | SUS304 | 8 | 2 | 1 | 1050 | mild | vinyltrimethoxysilane |
| Example 15 | 1.1 | 5.7 | 2.4 | 0.3 | | 20 | SUS304 | 8 | 2 | 1 | 1050 | mild | hexamethyldisilazane |
| Example 16 | 2.3 | 3.3 | 1.4 | 0.5 | | 15 | SUS304 | 8 | 2 | 1 | 1050 | mild | 3-glycidoxypropyl-trimethoxysilane |
| Example 17 | 1.3 | 5.1 | 2.1 | 1.0 | | 15 | SUS304 | 8 | 2 | 1 | 1050 | mild | 3-methacryloxypropyl-methyldimethoxysilane |
| Comparative Example 3 | 1.1 | 5.7 | 2.4 | 1.5 | drying under reduced pressure | — | — | — | — | — | 1050 | mild | vinyltrimethoxysilane |

TABLE 2

| amorphous silica | Fe content (ppm) | saturated moisture content (mass %) | average particle diameter (μm) | variation coefficient (%) | average spherical ratio | content of coarse particles (mass %) | $A_1/A_0$ | $A_2/A_0$ | $A_1/A_2$ |
|---|---|---|---|---|---|---|---|---|---|
| c1 | 44 | 0.03 | 1.3 | 7.2 | 1.0 | 0.01 | 0.0002 | 0.0014 | 0.15 |
| e1 | 14 | 0.03 | 1.3 | 7.2 | 1.0 | 0.01 | 0.0002 | 0.0014 | 0.15 |
| e2 | 6 | 0.03 | 1.3 | 7.2 | 1.0 | 0.01 | 0.0002 | 0.0014 | 0.15 |
| e3 | 10 | 0.03 | 1.3 | 7.2 | 1.0 | 0.01 | 0.0002 | 0.0014 | 0.15 |
| e4 | 1 | 0.03 | 1.3 | 7.2 | 1.0 | 0.01 | 0.0002 | 0.0014 | 0.15 |
| e5 | 3 | 0.03 | 0.2 | 4.6 | 1.0 | 0.01 | 0.0002 | 0.0014 | 0.15 |
| e6 | 2 | 0.03 | 0.2 | 4.6 | 1.0 | 0.01 | 0.0002 | 0.0014 | 0.15 |
| c2 | 65 | 0.03 | 1.3 | 7.2 | 1.0 | 0.02 | 0.0002 | 0.0014 | 0.15 |
| r1 | 18 | 0.03 | 1.3 | 7.2 | 1.0 | 0.38 | 0.0002 | 0.0014 | 0.15 |
| e7 | 5 | 0.02 | 0.4 | 4.2 | 1.0 | 0.01 | 0.0002 | 0.0014 | 0.15 |
| e8 | 5 | 0.03 | 0.9 | 6.0 | 1.0 | 0.01 | 0.0002 | 0.0014 | 0.15 |
| e9 | 6 | 0.03 | 1.0 | 6.2 | 1.0 | 0.03 | 0.0002 | 0.0014 | 0.15 |
| e10 | 6 | 0.02 | 1.3 | 7.2 | 1.0 | 0.10 | 0.00007 | 0.0007 | 0.10 |
| e11 | 10 | 0.01 | 1.3 | 7.2 | 1.0 | 0.03 | 0.00007 | 0.0007 | 0.10 |
| e12 | 5 | 0.40 | 0.4 | 4.2 | 1.0 | 0 | 0.001 | 0.0026 | 0.40 |
| e13 | 5 | 0.03 | 0.9 | 6.0 | 1.0 | 0.02 | 0.00013 | 0.001 | 0.13 |
| e14 | 14 | 0.03 | 1.3 | 7.2 | 1.0 | 0.01 | 0.0002 | 0.0014 | 0.15 |
| e15 | 3 | 0.03 | 0.2 | 4.6 | 1.0 | 0.01 | 0.0002 | 0.0014 | 0.15 |
| e16 | 5 | 0.02 | 0.4 | 4.2 | 1.0 | 0.01 | 0.0002 | 0.0014 | 0.15 |
| e17 | 5 | 0.03 | 0.9 | 6.0 | 1.0 | 0.01 | 0.0002 | 0.0014 | 0.15 |
| c3 | 65 | 0.03 | 1.3 | 7.2 | 1.0 | 0.01 | 0.0002 | 0.0014 | 0.15 |

Resin compositions were produced using the amorphous silicas (e1) to (e9), (e14) to (e17), (c1) to (c3), and (r1) obtained in the examples, comparative examples, and reference example, and the durability of a cured product, replicability of a die, and curing ability in injection were evaluated. The results are shown in Table 3.

[Durability of Cured Products]
(Production of Test Pieces)

An epoxy resin composition was prepared by mixing 100 parts by mass of a bisphenol A type epoxy resin (jER (registered trade name) 828, manufactured by Mitsubishi Chemical Corporation), 80 parts by mass of an acid anhydride-based curing agent as a curing agent (Rikacid (registered trade name) MH-700 G, manufactured by New Japan Chemical Co., Ltd., acid anhydride curing agent, 4-methyl-hexahydropthalic anhydride/hexahydrophthalic anhydride=70/30), and 1 part by mass of an imidazole-based curing accelerator as a curing accelerator. A curable resin composition was prepared by adding 60 parts by mass of each amorphous silica to 40 parts by mass of the epoxy resin composition, followed by mixing.

For the obtained curable resin composition, a die for injection was made ready by using 2 glass sheets subjected to release treatment and having a length of 200 mm and a width 50 mm, and a 4 mm spacer. The curable resin composition was injected to the die and heated at 180° C. for 6 hours by a heating furnace, and thereafter cooled and taken out of the die to obtain a sheet-shaped cured product having a thickness of 4 mm. The obtained cured product was cut into rectangular shape (thickness 4 mm) having a length of 80 mm and a width of 10 mm to produce 2 samples for a test.

(Heating and Pressurizing Treatment)

One of the samples for a test was put in a pressure heating furnace set at a temperature of 120° C. and vapor-phase pressure of 2 atm, and retained for 500 hours to carry out heating and pressurizing treatment.

(Bending Test)

The bending strength of the sample for a test which was not subjected to the heating and pressurizing treatment (sample A) and the sample for a test which was subjected to the heating and pressurizing treatment (sample B) was measured according to JIS K6911. An electromechanical universal testing machine (manufactured by INSTRON) was used for the measurement.

(Evaluation Standard)

The evaluation was based on the ratio of the bending strength of the sample (B) to that of the sample (A). That is, the bending strength ratio (bending strength of sample (B)/bending strength of sample (A)) was calculated and in the case where the bending strength ratio was 0.9 or more, it was rated as "⊙"; in the case of 0.8 or more and less than 0.9, it was rated as "○", and in the case of less than 0.8, it was rated as "x".

[Replicability of Die and Curing Ability in Injection]
(Production of Liquid-State Resin Composition)

A curable liquid-state resin composition was prepared by adding 200 parts by mass of amorphous silica particles to a mixture of 50 parts by mass of a bisphenol A type epoxy resin (jER 828, manufactured by Mitsubishi Chemical Corporation) and 50 parts by mass of an hydrogenated epoxy resin (jERYX-8000, manufactured by Mitsubishi Chemical Corporation), followed by mixing, and thereafter, adding 1 part by mass of a cationic curing catalyst (SI-100 L, manufactured by Sanshin Chemical Industry Co., Ltd.), followed by mixing.

(Replicability of Die)

The test of replicability of a die was carried out for each composition after 1-day storage (1 day passage) and after 1-week storage. Each composition was packed in a polypropylene resin container and stored in a closed state in a thermostat chamber retaining at a temperature of 10° C.±1° C.

A die with a bottom face of 40 mm×10 mm and a depth of 2 mm was made ready as the die to be used for the test. This die has an inner part (the packing part of the resin composition) with rectangular parallelepiped and a smooth surface that is subjected to release treatment. Each curable liquid-state resin composition was packed in a thickness of 1 mm in the die, heated in a heating furnace at 150° C. for 1 hour, thereafter, cooled and taken out of the die to obtain a cured and molded body. The surface of the molded body having contact with the bottom face of the die was observed with a loupe to confirm the presence or absence of coarse granular substances (coarse particles and agglomerates of the amorphous silica and granular substances supposed to be gelled substances), and the flatness was evaluated based on the following standard.

Rank A: No coarse granular substance was observed.
Rank B: A slight coarse granular substances were observed.
Rank C: A large quantity of coarse granular substances were observed.

(Curing Ability in Injection)

The test of curing ability in injection was carried out for each composition after 1-week storage. Each composition was packed in a polypropylene resin container and stored in a closed state in a thermostat chamber retaining at a temperature of 10° C.±1° C. A conical die with a space part tapered in the depth direction was made ready as the die to be used for the test. The inner surface of the die was subjected to chemical release treatment. Each curable liquid-state resin composition was injected into the die, heated in a heating furnace at 150° C. for 1 hour, thereafter, cooled and taken out of the die to obtain a cured and molded body. The shape of the tip end part of the molded body, corresponding to the deepest end of the die, was observed with a loupe and evaluated based on the following standard.

Rank A: The tip end shows the same shape as that of the die.
Rank B: The tip end shows a slightly chipped shape.
Rank C: The tip end shows a considerably chipped shape or rounded shape.

TABLE 3

| amorphous silica | durability of cured products | transcription ability of die | | curing ability in injection |
|---|---|---|---|---|
| | | after 1 day | after 1 week | |
| c1 | X | A | C | C |
| e1 | ◯ | A | B | B |
| e2 | ⊙ | A | A | A |
| e3 | ◯ | A | B | A |
| e4 | ⊙ | A | A | A |
| e5 | ⊙ | A | A | A |
| e6 | ⊙ | A | A | A |
| c2 | X | A | C | C |
| r1 | ◯ | C | C | B |
| e7 | ⊙ | A | A | A |
| e8 | ⊙ | A | A | A |
| e9 | ⊙ | B | B | B |
| e14 | ◯ | A | B | A |
| e15 | ⊙ | A | A | A |
| e16 | ⊙ | A | A | A |
| e17 | ⊙ | A | A | A |
| c3 | X | A | C | C |

It can be said from the results shown in Table 3.

With respect to the test of durability of a cured product, the cured and molded bodies containing the amorphous silica particles (e1) to (e17) and (r1) having a Fe content of less than 20 ppm are excellent in durability as compared with the molded bodies containing the amorphous silica particles (c1) to (c3) having a Fe content exceeding 20 ppm. Particularly the molded bodies containing the amorphous silica particles having a Fe content of 6 ppm or less are found to be more excellent in durability.

That is, the above-mentioned results imply that use of amorphous silica particles of the present invention having a Fe content of a specified value or less for a sealing material can stably protect conductive materials such as solder balls and metal wires (wiring), IC chips, and electronic parts for a long duration.

With respect to the test of replicability of a die, in the test of using each composition after 1 day, in the case of using the amorphous silica particles (e1) to (e17), (c1) to (c3) with a little amount of coarse particles, coarse granular substances were not observed in the surface of the cured product, or very slight if observed and in spite of that, in the case of the test of using each composition after 1 week, it is found that the coarse granular substances observed in the surface of the cured product are increased if the amorphous silica particles (e1), (e3), (e14), (c2) and (c3) with a large Fe content are used.

That is, it is implied that in the case where amorphous silica particles with a large Fe content are used, reaction of the epoxy resin, which becomes a cause of coarse granular substances, is possibly promoted in the surface of the amorphous silica particles during the storage of each composition, and micro-gel is produced. Even in the case of using amorphous silica particles with a high silanol group ratio, the same tendency is observed.

The results of storage for 1 week are shown in this case, and it is easily expected that the production of the coarse granular substances attributed to Fe could be further promoted as the storage term becomes longer. In other words, even if the coarse particles are lessened in the stage of producing amorphous silica particles, unless the Fe content of the amorphous silica particles is adjusted to a prescribed value or less, and preferably unless the amorphous silica particles are made to have a prescribed silanol group ratio, it becomes impossible to give excellent sealing in the above-mentioned sealing properties when a composition is stored for a long duration.

The results imply that use of a sealing resin composition obtained by using the amorphous silica particles of the present invention with a Fe content of specified value or less can be closely attached to the surfaces of conductive materials such as solder balls and metal wires (wiring), IC chips, and electronic parts, and can efficiently shut water from the environment since the coarse particles are few even after a long term storage. Further, it can be found that if the amorphous silica particles are those with a low coarse particle amount and with a low silanol group ratio, the above-mentioned effect could be further efficiently caused.

With respect to the test of curing ability in injection, it can be found that a composition using the amorphous silica particles with a low Fe content can be excellent in the injection property in a narrow region after preparation or even after 1 week. From this result, it is implied that a sealing resin composition using the amorphous silica particles of the present invention with a Fe content of specified value or less can firmly seal very narrow spaces in which conductive materials such as solder balls are present densely, similarly to underfill, and can efficiently shut water from the environment.

Further, it is shown that in the case of the amorphous silica particles (c3) with a Fe content of a specified value or more, even if treatment with a silane coupling agent is carried out, the composition was not improved in the injection property; whereas in the case of the amorphous silica particles (e14) with a Fe content of a specified value or less, the injection property of the composition is improved by the treatment with a silane coupling agent.

In the test of durability of a cured product, the test of replicability of a die, and the test of curing ability in injection, there are shown the effects of adjusting the Fe content to a specified value or less for amorphous silica particles with the respective average particle diameters in a range of 0.2 μm or larger and 1.3 μm or smaller, and preferably, allowing the amorphous silica particles to have a specified silanol group ratio; however, it is no need to say that the effect of the present invention can be caused even in the case where the average particle diameter is in a wider range.

In the examples, the effects are investigated while focusing on use in sealing materials for semiconductor mounting including sealing for underfill, the amorphous silica particles of the present invention exerts the effects not only in various kinds of sealing materials such as a sealing material for LEDs and a LCD sealing material, but also in a wide range of optical materials.

INDUSTRIAL APPLICABILITY

Fired amorphous silica with a very low Fe content could be obtained. Consequently, the amorphous silica particles of the present invention can be used for semiconductor fields, liquid crystal displays, and the like.

The invention claimed is:

1. A cured product comprising a gap between parts of the cured product and cured underfill encapsulant that fills the gap to the end, wherein the cured underfill encapsulant comprises an epoxy resin and a fired amorphous silica having a Fe content of 20 ppm or less and a variation coefficient in the particle diameter of 8% or less, and the gap is a gap between a semiconductor chip and a substrate or a gap among solder balls, and wherein the fired amorphous silica has a ratio ($A_1/A_2$) of a maximum absorbance ($A_1$) of a peak of isolated silanol group to a maximum absorbance ($A_2$) of a peak of silanol group derived from adsorbed water of 0.2 or less in an infrared absorption spectrum.

2. The cured product according to claim 1, wherein the fired amorphous silica has a ratio ($A_1/A_0$) of the maximum absorbance ($A_1$) of the peak of isolated silanol group to a maximum absorbance ($A_0$) of a peak of siloxane bond of 0.001 or less in the infrared absorption spectrum.

3. The cured product according to claim 1, wherein the underfill encapsulant further comprises an acid anhydride curing agent or a thermal cationic curing catalyst.

4. The cured product according to claim 1, wherein the fired amorphous silica has an average particle diameter of 0.1 µm or larger and 2 µm or smaller.

5. A process for producing an electronic part, comprising:
pouring an underfill encapsulant, which comprises an epoxy resin and a fired amorphous silica having a Fe content of 20 ppm or less and a variation coefficient in the particle diameter of 8% or less, into gaps of an object material to be sealed,
filling the gap with the underfill encapsulant to the end, and
curing the underfill encapsulant to obtain the electronic part, wherein the gap is a gap between a semiconductor chip and a substrate or a gap among solder balls, and wherein the fired amorphous silica has a ratio ($A_1/A_2$) of a maximum absorbance ($A_1$) of a peak of isolated silanol group to a maximum absorbance ($A_2$) of a peak of silanol group derived from adsorbed water of 0.2 or less in an infrared absorption spectrum.

6. The process for producing an electronic part according to claim 5, wherein the fired amorphous silica has a ratio ($A_1/A_0$) of the maximum absorbance ($A_1$) of the peak of isolated silanol group to a maximum absorbance ($A_0$) of a peak of siloxane bond of 0.001 or less in the infrared absorption spectrum.

7. The process for producing an electronic part according to claim 5, wherein the underfill encapsulant further comprises an acid anhydride curing agent or a thermal cationic curing catalyst.

8. The process for producing an electronic part according to claim 5, wherein the fired amorphous silica has an average particle diameter of 0.1 µm or larger and 2 µm or smaller.

9. The cured product according to claim 1, wherein the underfill encapsulant is capable of permeating a gap between a semiconductor chip and a substrate or a gap among solder balls.

10. The process for producing an electronic part according to claim 5, wherein the underfill encapsulant is capable of permeating a gap between a semiconductor chip and a substrate or a gap among solder balls.

* * * * *